(12) United States Patent
Yan et al.

(10) Patent No.: US 9,324,869 B1
(45) Date of Patent: Apr. 26, 2016

(54) METHOD OF FORMING A SEMICONDUCTOR DEVICE AND RESULTING SEMICONDUCTOR DEVICES

(71) Applicant: GLOBALFOUNDRIES Inc., Grand Cayman (KY)

(72) Inventors: Ran Yan, Dresden (DE); Alban Zaka, Dresden (DE); Jan Hoentschel, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 14/613,425

(22) Filed: Feb. 4, 2015

(51) Int. Cl.
| | |
|---|---|
| H01L 21/336 | (2006.01) |
| H01L 21/8234 | (2006.01) |
| H01L 29/78 | (2006.01) |
| H01L 29/66 | (2006.01) |
| H01L 21/308 | (2006.01) |
| H01L 21/306 | (2006.01) |
| H01L 29/10 | (2006.01) |
| H01L 21/762 | (2006.01) |
| H01L 29/04 | (2006.01) |
| H01L 29/06 | (2006.01) |

(52) U.S. Cl.
CPC .......... *H01L 29/7853* (2013.01); *H01L 21/308* (2013.01); *H01L 21/30604* (2013.01); *H01L 21/76224* (2013.01); *H01L 29/045* (2013.01); *H01L 29/0649* (2013.01); *H01L 29/1037* (2013.01); *H01L 29/66795* (2013.01); *H01L 29/7851* (2013.01); *H01L 2029/7858* (2013.01)

(58) Field of Classification Search
CPC ............ H01L 21/762; H01L 21/67075; H01L 21/467; H01L 21/475; H01L 21/76205; H01L 21/3141; H01L 21/31683; H01L 21/28158; H01L 21/02579; H01L 21/02576; H01L 21/3105; H01L 27/1104; H01L 27/0924; H01L 29/435; H01L 29/7831; H01L 27/0251; H01L 51/0508

USPC .......... 438/197, 311, 712, 692; 257/288, 350, 257/E21.006, E21.014, E21.023, E21.051, 257/E21.218, E21.229, E21.23, E21.231, 257/E21.267, E21.304, E21.314, E21.32, 257/E21.421, E21.435

See application file for complete search history.

(56) References Cited

U.S. PATENT DOCUMENTS

| | | | | |
|---|---|---|---|---|
| 7,851,283 B2* | 12/2010 | Anderson | ......... | H01L 29/41791 438/164 |
| 8,153,493 B2* | 4/2012 | Lee | ...................... | H01L 29/6659 438/294 |
| 8,742,491 B2* | 6/2014 | Lee | ...................... | H01L 29/6659 257/329 |
| 8,895,381 B1* | 11/2014 | Cheng | ................. | H01L 29/7847 438/197 |
| 8,928,086 B2* | 1/2015 | Utomo | ................ | H01L 29/7855 257/365 |

* cited by examiner

*Primary Examiner* — David Nhu

(74) *Attorney, Agent, or Firm* — Amerson Law Firm, PLLC

(57) ABSTRACT

The present disclosure provides, in various aspects, a method of forming a semiconductor device and accordingly formed semiconductor devices. In accordance with some illustrative embodiments herein, a fin is provided in an upper surface of a substrate, the fin having a height dimension and an initial width dimension. After forming a mask on the fin, wherein the mask only partially covers an upper surface of the fin, the fin is exposed to an etch process for removing material in accordance with the mask such that a channel portion connecting end portions of the fin is formed. Herein, a width dimension of the channel portion is smaller than a width dimension of the end portions. In accordance with some illustrative embodiments of the present disclosure, the channel portion may substantially have a cross-section of one of a triangular shape and a double-sigma shape.

20 Claims, 7 Drawing Sheets

METHOD OF FORMING A SEMICONDUCTOR DEVICE AND RESULTING SEMICONDUCTOR DEVICES

BACKGROUND OF THE INVENTION

1. Field of the Invention

The present disclosure relates to a method of forming a semiconductor device and the resulting semiconductor devices, and, more particularly, to the fabrication of complex FinFET structures with advanced fabrication technologies.

2. Description of the Related Art

In modern electronic equipment, integrated circuits (ICs) experience a vast applicability in a continuously spreading range of applications. In particular, the demand for increasing mobility of electronic devices at high performance and low energy consumption drives developments to more and more compact devices having features with sizes significantly smaller than 1 µm, the more so as current semiconductor technologies are apt of producing structures with dimensions in the magnitude of 100 nm or less. With ICs representing a set of electronic circuit elements integrated on a semiconductor material, normally silicon, ICs may be made much smaller than any discreet circuit composed of separate independent circuit components. Indeed, the majority of present-day ICs are implemented by using a plurality of circuit elements, such as field effect transistors (FETs), also called metal oxide semiconductor field effect transistors or MOSFETs, occasionally also simply referred to as MOS transistors, and passive elements, such as resistors, e.g., diffusion resistors, and capacitors, integrated on a semiconductor substrate within a given surface area. Typical present-day ICs involve millions of single circuit elements formed on a semiconductor substrate.

The basic function of a MOSFET is that of an electronic switching element, controlling a current through a channel region provided between two junction regions which are referred to as source and drain. The control of the conductivity state of the channel region is achieved by means of a gate electrode which is disposed over the channel region and to which a voltage relative to source and drain is applied. In common planar MOSFETs, the channel region extends in a plane between source and drain. Generally, in applying a voltage exceeding a characteristic voltage level to the gate electrode, the conductivity state of the channel is changed, and switching between a conducting state or "ON-state" and a non-conducting state or "OFF-state" may be achieved. It is important to note that the characteristic voltage level at which the conductivity state changes (usually called the "threshold voltage") therefore characterizes the switching behavior of the MOSFET and it is generally an issue to keep variations in the threshold voltage level low for implementing a well-defined switching characteristic. However, with the threshold voltage depending nontrivially on the transistor's properties, e.g., materials, dimensions, etc., the implementation of a desired threshold voltage value during fabrication processes involves careful adjustment and fine tuning during the fabrication processes, which makes the fabrication of complex semiconductor devices by advanced technologies more and more difficult.

In general, it was observed that, with the sizes of individual MOSFETs having steadily decreased over the last decades, strongly scaled MOSFETs more and more suffered from undesirable effects once the length of the channel of a MOSFET entered the same order of magnitude as the width of the depletion layer of source and drain. For strongly scaled MOSFETs, for example, the OFF-state leakage current (i.e., the leakage current during the OFF-state) increased with the idle power required by the device. Accordingly, these deteriorating effects, which appear at small scales and are associated with a short channel length, are frequently referred to as so-called "short channel effects." In order to continue to lower scales, tremendous efforts are needed to address the issues of marginalities, variabilities and challenges appearing in the scaling towards VLSI (very large scale integration) MOSFET technologies at, for instance, 20 nm or less, such that all the marginalities in each individual process step and all variabilities are properly addressed and, at best, reduced.

In the efforts of overcoming the above-described issues encountered when reaching smaller and smaller scales, multi-gate MOSFET devices have been proposed. A kind of multi-gate MOSFET device is realized as a so-called "FinFET," which represents a type of transistor that addresses issues arising when reducing the transistor size, while maintaining the transistor's performance. FinFETs generally represent three-dimensional transistors formed by thin fins extending upwardly from a semiconductor substrate. In a FinFET, the transistor channel is formed along the vertical sidewalls of the fin, which is also referred to as a "double-gate transistor," or along the vertical sidewall surfaces and the upper horizontal surface of the fin leading to so-called "tri-gate transistors." Double-gate transistors and tri-gate transistors have wide channels and, on the other hand, high performance, which may be achieved without substantially increasing the area of the substrate surface required by these transistors because a transistor's performance, being measured by its transconductance, is proportional to the width of the transistor channel. Therefore, by the multi-gate configuration provided by the three-dimensional channel of FinFETs, these semiconductor devices allow for a better control of the channel region when compared to common planar transistor devices.

Upon further decreasing the sizes of FinFETs, it is observed that the series resistance between source and drain relative to the channel is considerably increased. Particularly, complex FinFETs at advanced scales, which FinFETS are often implemented as silicon wires having a height of about 20 nm and a width of about 5 nm, show a series resistance from source/drain to the channel region which becomes unacceptably high. In simply scaling FinFETs down to more advanced scales, the performance of complex FinFETs fabricated by VLSI techniques cannot be maintained to a sufficient degree at present.

In view of the above-described situation, it is, therefore, desirable to provide a method of forming a semiconductor device structure and semiconductor device structures such that the above-described issues and problems associated with complex FinFETs at advanced technology nodes is at least reduced, if not, avoided.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

The present disclosure provides methods of forming a semiconductor device and semiconductor devices where the resistance between source/drain to a channel of a FinFET is reduced by providing an enlarged silicon film outside of a gate area, particularly at source/drain.

According to a first aspect of the present disclosure, a method of forming a semiconductor device is provided. In accordance with some illustrative embodiments herein, the method includes providing a fin with a height dimension and an initial width dimension in an upper surface of a substrate, forming a mask on the fin, the mask partially covering an upper surface of the fin, exposing the fin to an etch process for removing material in accordance with the mask so as to form a channel portion connecting end portions of the fin, wherein a width dimension of the channel portion is smaller than a width dimension of the end portions, and forming a gate structure over the channel portion.

According to a second aspect of the present disclosure, a semiconductor device is provided. In accordance with some illustrative embodiments herein, the semiconductor device includes a fin provided in an upper surface of a substrate, the fin having a channel portion with a first width dimension and source/drain portions connected by the channel portion, the source/drain portions having a second width dimension which is substantially greater than the first width dimension, and a gate electrode disposed over the channel portion, wherein the channel portion substantially has a cross-section of a triangular shape.

According to a third aspect of the present disclosure, a semiconductor device is provided. In accordance with some illustrative embodiments herein, the semiconductor device includes a fin provided in an upper surface of a substrate, the fin having a channel portion with a first width dimension and source/drain portions connected by the channel portion, the source/drain portions having a second width dimension which is substantially greater than the first width dimension, and a gate electrode disposed over the channel portion, wherein the channel portion substantially has a cross-section of a double-sigma shape.

BRIEF DESCRIPTION OF THE DRAWINGS

The disclosure may be understood by reference to the following description taken in conjunction with the accompanying drawings, in which like reference numerals identify like elements, and in which.

Figure 1A:
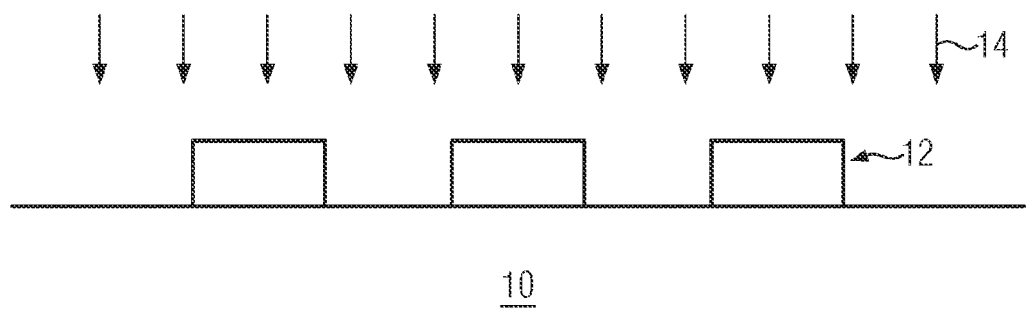
FIGS. 1a-1d schematically illustrate, in cross-sectional views, a process of forming a plurality of fins in an upper surface of a semiconductor device in accordance with some illustrative embodiments of the present disclosure.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will, of course, be appreciated that, in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present disclosure will now be described with reference to the attached figures. Various structures, systems and devices are schematically depicted in the drawings for purposes of explanation only and so as to not obscure the present disclosure with details which are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary or customary meaning as understood by those skilled in the art, is intended to be implied by consistent usage of the term or phrase herein. To the extent that a term or phrase is intended to have a special meaning, i.e., a meaning other than that understood by skilled artisans, such a special definition shall be expressively set forth in the specification in a definitional manner that directly and unequivocally provides the special definition for the term or phrase.

The present disclosure relates to a method of forming a semiconductor device and two semiconductor devices, wherein the semiconductor devices are integrated on or in a chip. In accordance with some illustrative embodiments of the present disclosure, the semiconductor devices may substantially represent FETs, e.g., MOSFETs or MOS devices. When referring to MOS devices, the person skilled in the art will appreciate that, although the expression "MOS device" is used, no limitation to a metal-containing gate material and/or to an oxide-containing gate dielectric material is intended.

Semiconductor devices of the present disclosure concern devices which are fabricated by using advanced technologies, i.e., the semiconductor devices are fabricated by technologies applied to approach technology nodes smaller than 100 nm, for example smaller than 50 nm or smaller than 35 nm. The person skilled in the art will appreciate that, according to the present disclosure, ground rules smaller or equal to 45 nm may be imposed. The person skilled in the art will appreciate that the present disclosure proposes semiconductor devices with structures of minimal length and/or width dimensions smaller than 100 nm, for example, smaller than 50 nm or smaller than 35 nm. For example, the present disclosure may provide semiconductor devices fabricated by using 45 nm technologies or below, e.g., 28 nm or even below.

The person skilled in the art will appreciate that semiconductor devices may be fabricated as P-channel MOS transistors or PMOS transistors and N-channel transistors or NMOS transistors; both types of transistors may be fabricated with or without mobility-enhancing stressor features or strain-inducing features. It is noted that a circuit designer can mix and match device types, using PMOS and NMOS devices, stressed and unstressed, to take advantage of the best characteristics of each device type as they best suit the semiconductor device being designed.

In the following, various illustrative embodiments of the present disclosure will be explicitly described with regard to the enclosed figures, wherein fin structures are provided in an upper surface of a substrate.

FIG. 1a schematically illustrates, in a cross-sectional view, a substrate 10. The substrate 10 may be a semiconductor substrate, e.g., a semiconductor bulk substrate or a semiconductor-on-insulator (SOI) substrate or a silicon/germanium-on-insulator (SGOI) substrate. In general, the terms "substrate," "semiconductor substrate" or "semiconducting substrate" should be understood to cover all semiconductor materials in all forms of such semiconductor materials and no limitation to a special kind of substrate is intended. The person skilled in the art will appreciate that, in some illustrative embodiments in which the substrate 10 represents an SOI substrate configuration cover, a thin silicon film (not illustrated) disposed on a buried oxide or BOX layer (not illustrated), which in turn is formed on a semiconductor substrate or a base wafer (not illustrated), may be present.

Referring to FIG. 1a, a masking pattern 12 is further provided on an upper surface of the substrate 10. The person skilled in the art will appreciate that the masking pattern may comprise a photo resin and may be, for example, lithographically patterned. In accordance with some alternative embodiments, the masking pattern 12 may be formed by a layer stack comprising an oxide layer, a nitride layer and photoresist, on which layer stack a patterned photo resin is provided.

Next, an etch process 14 is performed in alignment with the masking pattern 12 provided on the substrate 10. In accordance with some illustrative embodiments, the etch process 14 may at least comprise an anisotropic etch process, such as a dry etch process. In accordance with some special, but not limiting examples, the etch process 14 may at least comprise a reactive ion etch (RIE) process.

Figure 1B:
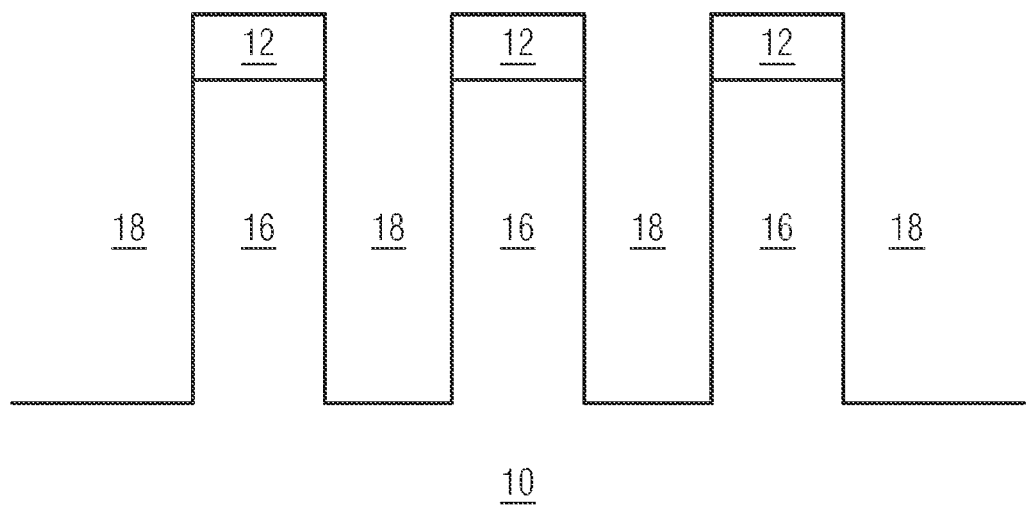

Referring to FIG. 1b, the semiconductor substrate 10 is schematically depicted at a more advanced stage during fabrication, particularly at a stage when the etch process 14 is completed. As illustrated in FIG. 1b, a plurality of fins 16 is formed in the upper surface of the semiconductor substrate 10 in accordance with the masking pattern 12 after the etch process 14 is completed, the fins being delineated by trenches 18 etched into the semiconductor substrate 10 in accordance with the masking pattern 12. In accordance with some illustrative examples herein, a depth of the trenches 18 in the substrate 10 may be greater than 30 nm, particularly greater than 50 nm, e.g., an illustrative trench 18 may have a depth of about 100 nm.

Figure 1C:
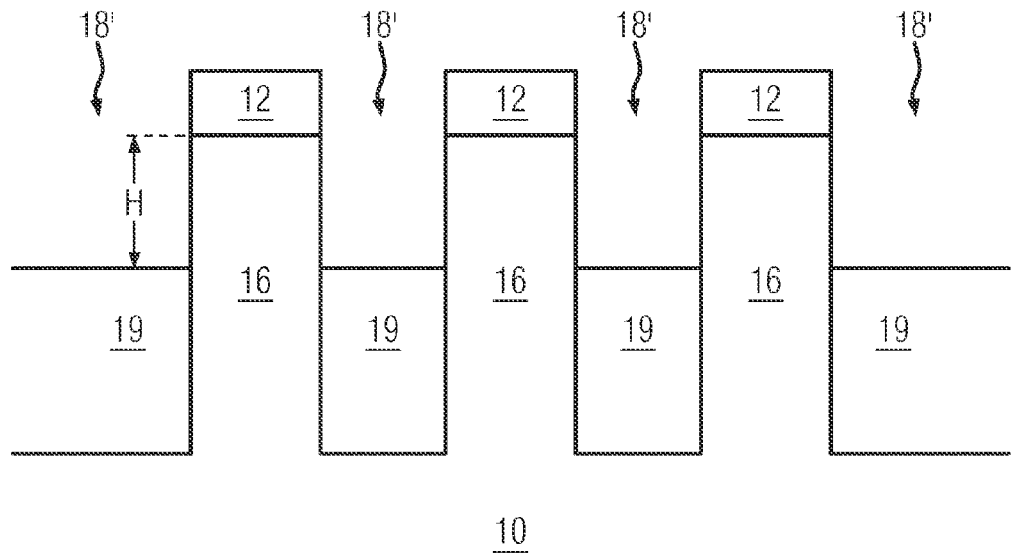

Next, a filling process (not illustrated) is performed for filling the trenches 18 with an insulating material 19, e.g., an oxide material, up to a certain height level such that portions of the fins 16 extending away from the insulating material 19 have a predetermined height dimension H, as shown in FIG. 1c. In accordance with some illustrative examples, the height dimension H may be of, for example, about 30 nm.

In accordance with some illustrative embodiments of the present disclosure, the filling process (not illustrated) may be performed so as to adjust the height dimension H of exposed portions of the fins 16 by overfilling the trenches 18 with insulating material 19, polishing the insulating material and performing a time-controlled etching process (not illustrated) to recess the insulating material 19 such that trenches 18' of a predetermined depth are produced and the height dimension H is obtained. Accordingly, as schematically illustrated in FIG. 1c, the fins 16 have the height dimension H, which is also referred to as an active height dimension, and are separated by the trenches 18' provided in the upper surface of the semiconductor substrate 10.

Figure 1D:
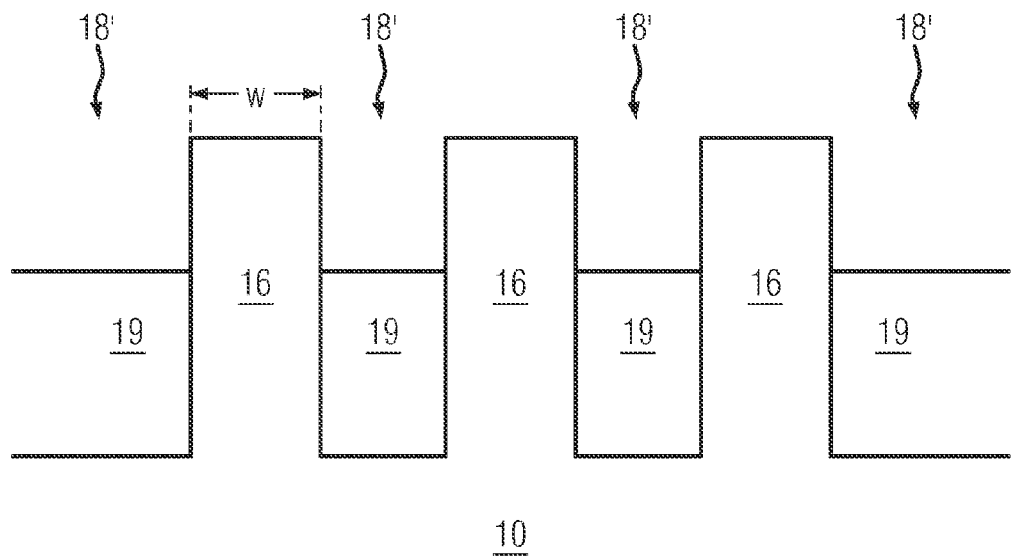

Next, as illustrated in FIG. 1d, the masking pattern 12 may be removed, e.g., by a strip process (not illustrated). The person skilled in the art will appreciate that a plurality of fins 16 having the height dimension H (FIG. 1c) and a width dimension W (FIG. 1d) are obtained. In accordance with some illustrative embodiments of the present disclosure, the height dimension H and/or the width dimension W may be on the order of about 30 nm.

The person skilled in the art will appreciate that, in accordance with some illustrative embodiments of the present disclosure as described above with regard to FIGS. 1a-1d, a fin (one of the fins 16) having a height dimension (indicated by H in FIG. 1c) and an initial width dimension (indicated by W in FIG. 1d) is provided in an upper surface of the substrate 10.

Figure 2A:
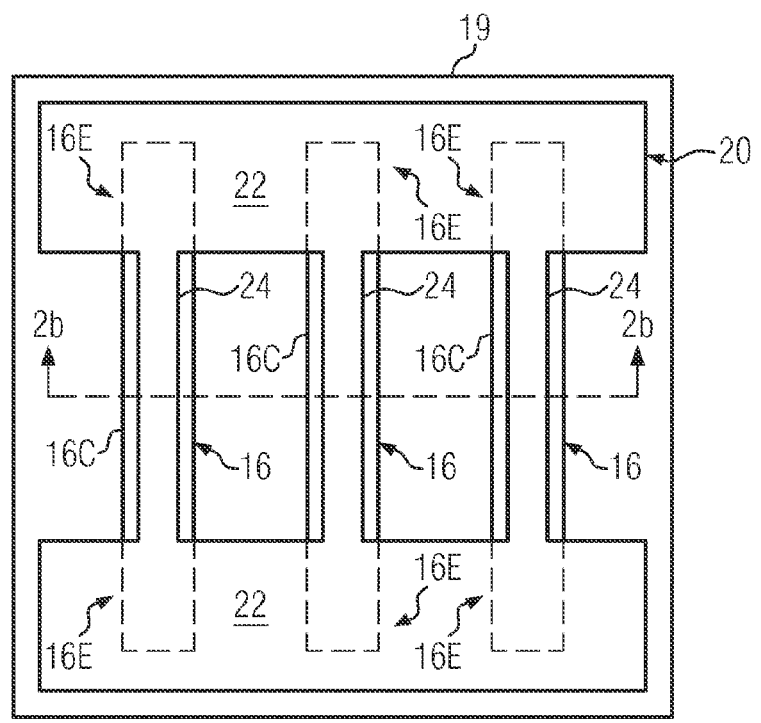
FIG. 2a schematically illustrates a top view of the plurality of fins at a later stage during fabrication in accordance with some illustrative embodiments of the present disclosure, wherein a mask is formed.

Referring to FIG. 2a, the semiconductor substrate 10 and, particularly, the plurality of fins 16 are schematically illustrated in a top view at a more advanced stage during fabrication, particularly after a mask 20 is formed over the substrate 10, wherein the mask 20 partially covers each of the fins 16.

In accordance with some illustrative embodiments of the present disclosure, the mask 20 may comprise mask end portions 22 and mask channel portions 24, wherein the mask end portions 22 cover end portions 16E of the fins 16 at opposing ends of the fins 16. In particular, the mask end portions 22 are formed on the end portions 16E of the fins 16 to cover portions of the fins 16 in which the source/drain regions are to be formed at a later stage. In order to provide a clear understanding, the end portions 16E (which are actually covered by the mask end portions 22) of the fins 16 are indicated in FIG. 2a by broken lines. As illustrated in FIG. 2a, the mask end portions 22 are connected by the mask channel portion 24 which partially covers a central portion 16C (or channel portion as this will represent the channel region of the fabricated semiconductor device) of each fin 16. In accordance with some illustrative examples of the present disclosure, the mask end portions 22 may, as it is illustrated in FIG. 2a, have a substantially rectangular shape with a width dimension of at least the width W of the fins 16. For example, the mask 20 may cover end portions 16E of more than one fin 16 by forming appropriately dimensioned mask end portions 22, as it is illustrated in FIG. 2a, whereas, in alternative embodiments of the present disclosure (which are not illustrated in the figures), the mask 20 may be composed of a plurality of unconnected sub-masks (not illustrated) which may have unconnected mask end portions (not illustrated), that is, each fin may be covered by an associated masking pattern that is not connected to the masking pattern of another fin.

Figure 1E:
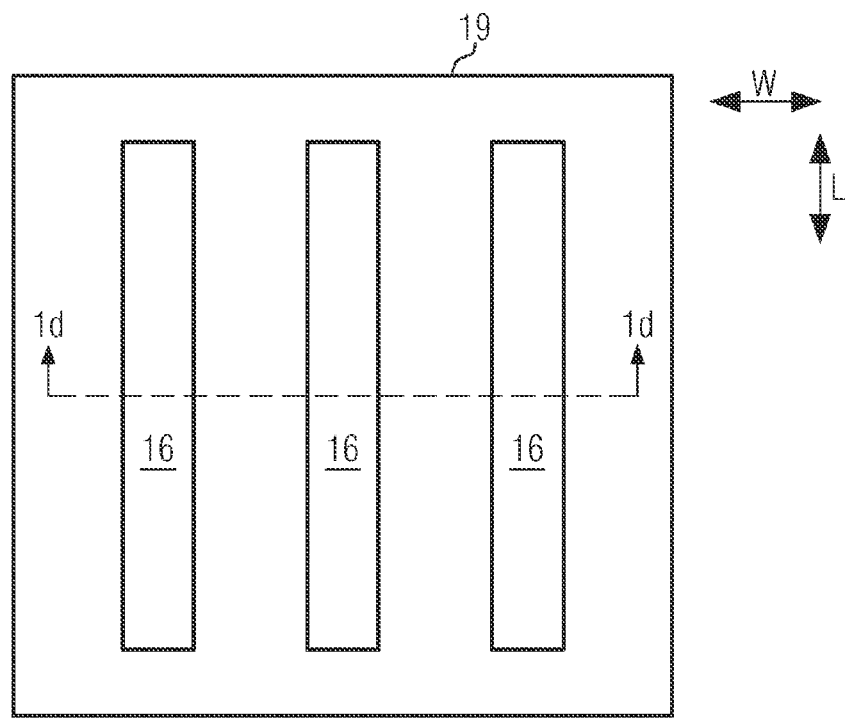
FIG. 1e schematically illustrates a top view of the plurality of semiconductor devices of FIG. 1d in accordance with some illustrative embodiments of the present disclosure.

In accordance with some illustrative examples of the present disclosure, the mask channel portion 24 may be of a substantially strip-like shape that extends between the mask end portions 22 along the length dimension L (see FIG. 1e), as it is illustrated in FIG. 2a. Particularly, a width dimension of each mask channel portion 24 may be substantially smaller than the width dimension W (see FIG. 1e) of the respective fin 16. Accordingly, the central portion 16C of each fin 16 is only partially covered by the respective mask channel portion 24.

In accordance with some illustrative embodiments, a length dimension of the mask channel portion 24 may be substantially equal to or greater than a length of a gate electrode (not illustrated) which is to be formed over a channel region of the fins 16 at a later stage during fabrication.

Figure 2B:
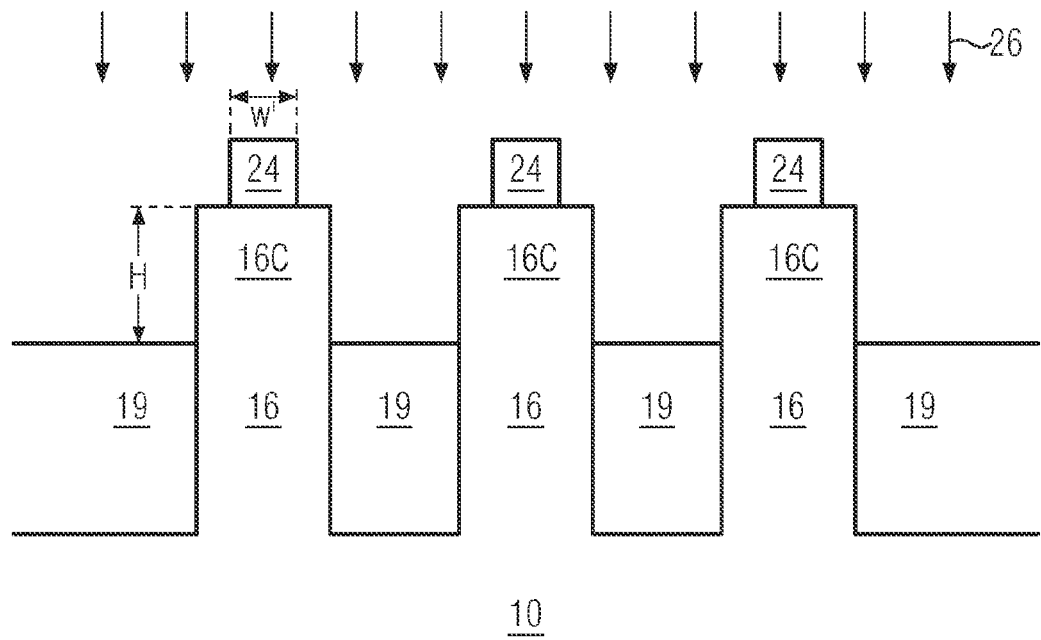
FIG. 2b schematically illustrates, in a cross-sectional view, the plurality of fins as depicted in FIG. 2a in accordance with some illustrative embodiments of the present disclosure.

Referring to FIG. 2b, a cross-section along the lines 2b-2b in FIG. 2a is schematically illustrated. Herein, a width dimension W' of the mask channel portion 24 is indicated.

Next, the fins 16 are exposed to an etch process for removing material in accordance with the mask 20 so as to form a channel portion connecting end portions of the fin, wherein a width dimension of the channel portion corresponding to the width dimension W' is smaller than the width dimension W of the fin 16 at the end portions 16E of the fins 16, i.e., W'<W. In accordance with some illustrative examples herein, the etch process may comprise an anisotropic wet etch step which forms the channel portions of the fins 16. For example, the anisotropic wet etch may comprise an etchant, such as TMAH or EDP or KOH, to etch the fins 16 relative to the mask 20 and the insulating material 19.

In accordance with some illustrative embodiments of the present disclosure employing an anisotropic wet etch, a crystal orientation of the substrate 10 may be provided such that a crystal orientation of an upper surface of the substrate 10 is substantially parallel to the <100> crystal direction, while a normal direction of the upper surface of the substrate 10 may be substantially parallel to the <100> crystal direction of the substrate 10. The person skilled in the art will appreciate that, in accordingly providing the substrate 10, the fins 16 may have upper surfaces with crystallographic orientations parallel to the <110> crystal direction (that is, the width dimensions W and W' are substantially parallel to the <110> crystal direction) and sidewall surfaces (surfaces parallel to the height dimension H) having a crystallographic orientation substantially parallel to the <100> crystal direction (that is, the height dimension H is substantially parallel to the <100> crystal direction). When the etch process 26 is applied to an according configuration of the fins 16, etch rates of the etch process 26 on the <100> crystal direction and the <110> crystal direction are substantially faster than the etch rate in the <111> crystal direction (that is crystal planes having an orientation in accordance with one of the directions <100> and <110> are substantially faster etched than crystal planes in the <111> crystal direction). Therefore, the etch process 26 may be configured to be self-limiting by terminating on surfaces being orientated in parallel to the <111> crystal direction. As the <111> crystal direction forms an angle of 54.7° with the <100> crystallographic direction, accordingly tilted surfaces relative to the upper surface of the substrate 10 may be obtained after the etch process 26 is completed.

The person skilled in the art will appreciate that in dependence on the height dimension H of the fins 16 and/or the width dimension W of the fins 16 and/or the width dimension W' of the mask channel portions 24, different shapes for the channel portion of each fin 16 may be obtained. For example, if H is smaller or equal to W' times tan 54.7°, a double-sigma shaped central fin portion 16C may be formed. On the other hand, if H is greater than W' times tan 54.7°, a triangularly shaped central portion of each fin 16 may be formed, as will be described below in greater detail.

Figure 3A:
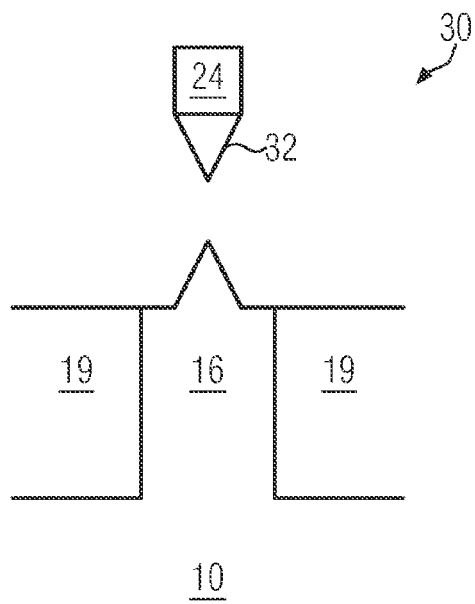
FIGS. 3a-3d schematically illustrate further processing of a fin in accordance with some illustrative embodiments of the present disclosure.

Referring to FIG. 3a, some illustrative embodiments of the present disclosure are schematically illustrated, wherein a triangularly shaped channel portion 32 may be obtained upon completion of the etch process 26. Particularly, the channel portion 32 may be separated from the remaining fin material 16 below the channel portion 32.

FIG. 3a schematically illustrates a semiconductor device 30 being formed by one of the fins 16. For example, the fin 16 is fabricated in accordance with a process as described with regard to various illustrative embodiments of the present disclosure as depicted in FIGS. 1a to 2b. That is, the height dimension H of the fin 16 and the width dimension W' of the mask channel portion 24 (FIG. 2b) may be such that H/W' is substantially greater than tan 54.7°.

Figure 3B:
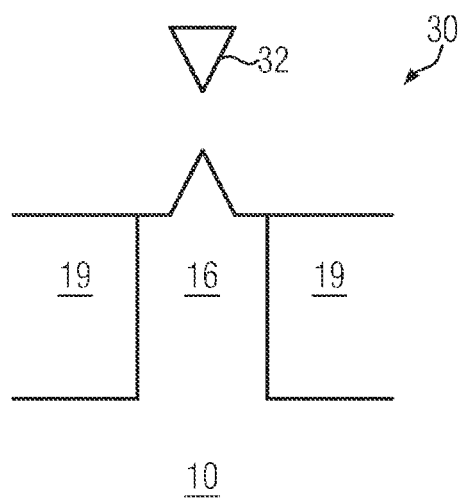

Referring to FIG. 3b, the semiconductor device 30 is schematically illustrated at a more advanced stage during fabrication, wherein the mask 20, and particularly the mask channel portion 24, is removed, e.g., by a strip process (not illustrated).

Figure 3C:
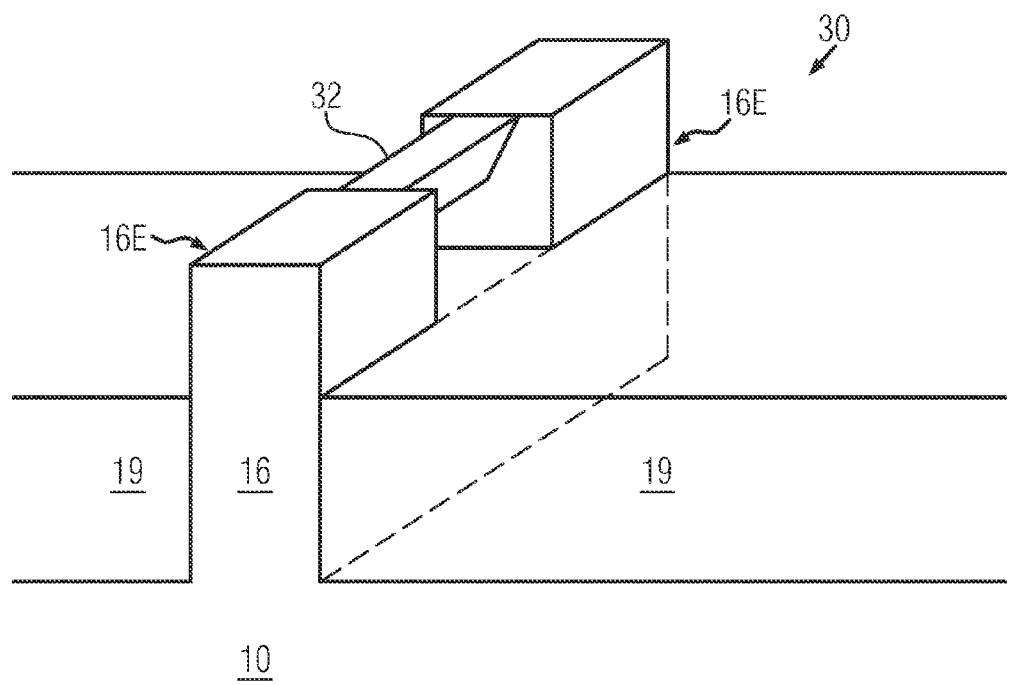

FIG. 3c schematically illustrates in a prospective view the semiconductor device 30 obtained after the etch process 26 is applied and the mask 20 is removed.

Figure 3D:
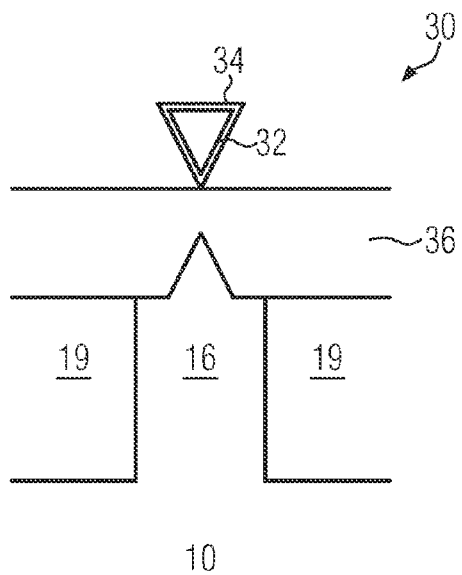

FIG. 3d schematically illustrates the semiconductor device at a more advanced stage during fabrication, wherein a gate insulating material 34, e.g., an oxide material such as silicon oxide, a high-k material (e.g., hafnium oxide), etc., is formed around the triangularly shaped channel portion 32 and an insulating material 36, e.g., one of a nitride material and an oxide material, is filled into the trenches 18' at opposing sides of the fin 16. For example, the insulating material 36 may be formed by known techniques. For example, the height of the insulating material 36 may be formed in accordance with methods as performed (FIG. 1c) for adjusting the height of insulating material 19 in the trenches 18 between the fins 16 for adjusting an active fin height H of the fins 16 (e.g., a process comprising overfilling, CMP and time-controlled etch sequences). Accordingly, a channel of silicon-on-nothing (SON) type may be formed for the semiconductor device 30, wherein the channel is of a gate-all-around type. The person skilled in the art will appreciate that, upon filling an insulating material 36 below the triangularly shaped channel portion 32, an application of back bias to the semiconductor device 30 for verifying the Vt of the semiconductor device 30 is enabled.

In accordance with some illustrative examples of the present disclosure, a width of the channel portion 32 may be substantially smaller than or equal to 27 nm.

Figure 4A:
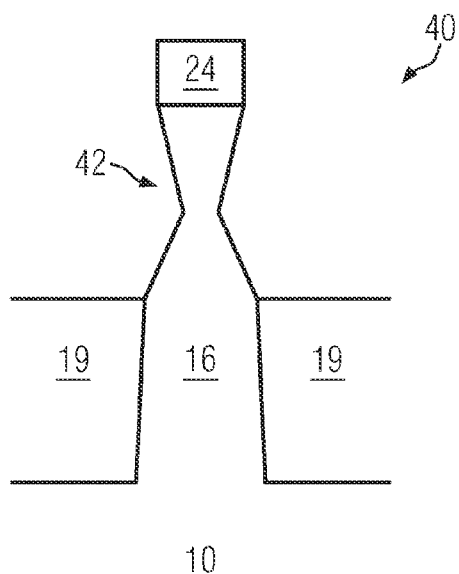
FIGS. 4a-4c schematically illustrate, in cross-sectional views, further processing of a FIN in accordance with other illustrative embodiments of the present disclosure.

With regard to FIGS. 4a-4c, some alternative embodiments of the present disclosure will be described, wherein the etch process 26 results in a channel portion 42 of a substantial double-sigma shape, that is, sidewalls of each channel portion 42 show a sigma shape. The semiconductor device 40, as illustrated in FIG. 4a, therefore, has the double-sigma shaped channel portion 42 which is in contact with remaining material of the fin 16 below, which material is embedded into the insulating material 19.

Figure 4B:
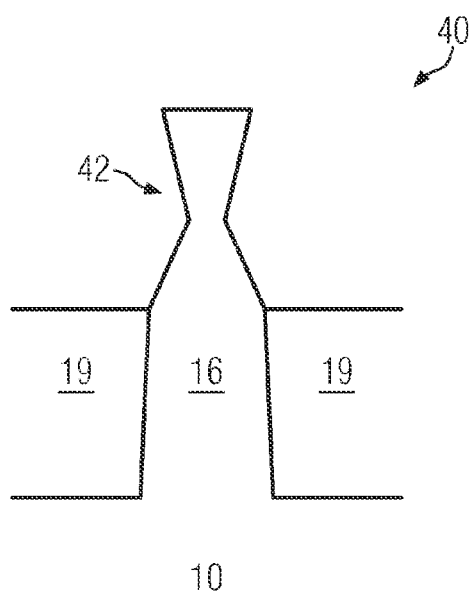

Referring to FIG. 4b, the semiconductor device 40 is illustrated at a more advanced stage during fabrication, particularly, after the mask 20 is removed and, optionally, an insulating material layer 46 is formed on the insulating material 19 in the trenches 18' (see FIG. 1d). It is noted that the insulating material layer 46 may be formed in accordance with the insulating material layer 36 as described with regard to FIG. 3d above, e.g., by filling one of a nitride material and an oxide material into the trenches 18' (see FIG. 1d) at opposing sides of the fin 16 (see FIG. 1d), i.e., at opposing sides of the lower portion of the double-sigma shaped channel portion 42.

Figure 4C:
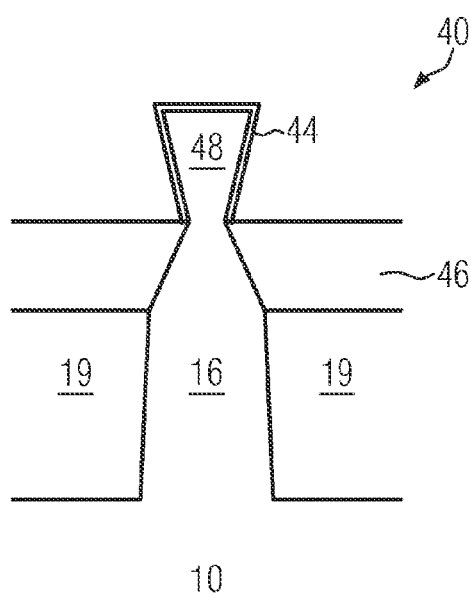

FIG. 4c schematically illustrates the semiconductor device at a more advanced stage during fabrication, particularly, after a gate insulating material 44 is deposited over an upper exposed fin portion 48 which is not embedded into the insulating material layer 46. In accordance with some illustrative embodiments of the present disclosure, the gate insulating material 44 may comprise at least one of an oxide material (e.g. silicon oxide), a high-k material (e.g., hafnium oxide), etc. As illustrated in FIG. 4c, the gate insulating material 44 is formed around the upper exposed fin portion 48 of the double-sigma shaped channel portion 42 (see FIGS. 4a, 4b). The person skilled in the art will appreciate that, in case that the insulating material layer 46 is omitted, a double-sigma shaped gate of the tri-gate type may be formed. In case that the insulating material layer 46 is present, a tri-gate of the omega shape may be formed.

In accordance with some illustrative embodiments, a width of the upper surface of the double-sigma shaped channel portion 42 may be substantially smaller than or equal to 27 nm.

Subsequent to the stages illustrated in FIGS. 3d and 4c, conventional processing may continue, involving FinFET surface clean processes, gate formation processes (in accordance with known gate first, gate last or hybrid gate approaches), source/drain implantations into the end portions 16E of the fins, etc. The person skilled in the art will appreciate that source/drain regions may be implanted into the end portions 16E and, alternatively, source/drain regions may be formed by implanting dopants into the end portions 16E and part of the channel portion 16C of the fins 16 in alignment with gate structures (not illustrated).

The person skilled in the art will appreciate that at least one of the insulating material layers 36 and 46 may have a thickness of 10 nm or below.

The present disclosure proposes in various aspects multi-gate semiconductor devices for technologies below 28 nm, e.g., beyond 14 nm. The multi-gate semiconductor devices show excellent short-channel characteristics due to the efficient control of the channel region by a gate on more than one side of the channel and multi-gate semiconductor devices have a high current drive per unit area of silicon real estate because of the formation of multiple channels.

Furthermore, semiconductor devices in accordance with various aspects of the present disclosure show a better channel control as compared to conventional semiconductor devices. Furthermore, methods of forming semiconductor devices in accordance with various illustrative embodiments of the present disclosure allow creating gate-all-around (GAA) and silicon on nothing/SOI transistors. The person skilled in the art will appreciate that no epitaxy techniques are required when forming source/drain regions in accordance with the present disclosure.

The person skilled in the art will appreciate that the present disclosure provides, in various aspects, a method of forming a semiconductor device and accordingly formed semiconductor devices. In accordance with some illustrative embodiments herein, a fin is provided in an upper surface of a substrate, the fin having a height dimension and an initial width dimension. After forming a mask on the fin, wherein the mask only partially covers an upper surface of the fin, the fin is exposed to an etch process for removing material in accordance with the mask such that a channel portion connecting end portions of the fin is formed. Herein, a width dimension of the channel portion is smaller than a width dimension of the end portions. In accordance with some illustrative embodiments of the present disclosure, the channel portion may substantially have a cross-section of one of a triangular shape and a double-sigma shape.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of forming a semiconductor device, the method comprising:
    providing a fin with a height dimension and an initial width dimension in an upper surface of a substrate;
    forming a mask on said fin, said mask partially covering an upper surface of said fin;
    exposing said fin to an etch process for removing material in accordance with said mask so as to form a channel portion connecting end portions of said fin, wherein a width dimension of said channel portion is smaller than a width dimension of said end portions; and
    forming a gate structure over said channel portion.

2. The method of claim 1, wherein said etch process comprises an anisotropic wet etch step.

3. The method of claim 1, wherein said mask comprises mask end portions covering said end portions, said mask end portions being connected by a mask channel portion extending between said mask end portions.

4. The method of claim 1, wherein, when seen in a top view of said fin, said mask end portions substantially are of a rectangular shape and said mask channel portion substantially is of a strip shape.

5. The method of claim 1, wherein at least one of said initial width dimension and said height dimension is at least about 30 nm.

6. The method of claim 1, wherein said width dimension of said channel and said height dimension of said fin are chosen such that said etch process results in a channel portion substantially having a cross-section of a double-sigma shape.

7. The method of claim 6, further comprising depositing an insulating material on said double-sigma shaped channel portion such that a part of said channel portion remaining uncovered substantially has an omega-shaped cross-section.

8. The method of claim 1, wherein said width dimension of said channel and said height dimension of said fin are chosen such that said etch process results in a channel portion substantially having a cross-section of a triangular shape, wherein said channel portion is directly disposed on an insulating material layer.

9. The method of claim 8, wherein said insulating material layer separates said channel portion of said fin from remaining fin material below said channel portion.

10. The method of claim 9, wherein said insulating material layer is formed in trenches provided in said substrate at opposing sides of said fin for delineating said fin in said upper surface, said trenches being partially filled with shallow trench isolation (STI) material for adjusting said height dimension of said fin before said etch process is applied, and wherein said insulating material layer is formed on said STI material after said channel portion is formed.

11. The method of claim 10, wherein said insulating material layer is deposited to a thickness of less than about 15 nm.

12. The method of claim 1, wherein said fin is provided in said substrate such that said initial width dimension is substantially parallel to a <110> crystal direction of said substrate and said height dimension is substantially parallel to a <100> crystal direction of said substrate.

13. A semiconductor device, comprising:
    a fin provided in an upper surface of a substrate, said fin having a channel portion with a first width dimension and source/drain portions connected by said channel portion, said source/drain portions having a second width dimension which is substantially greater than said first width dimension; and a gate electrode disposed over said channel portion;

wherein said channel portion has a cross-section of a substantially triangular shape.

14. The semiconductor device of claim 13, wherein said channel portion is surrounded by said gate electrode such that a gate-all-around type gate is provided.

15. The semiconductor device of claim 13, wherein said first and second width dimensions are substantially parallel to a <110> crystal direction of said substrate and a height dimension of said fin is substantially parallel to a <100> crystal direction of said substrate.

16. The semiconductor device of claim 13, wherein said first width dimension is substantially smaller than about 27 nm.

17. The semiconductor device of claim 13, wherein said first and second width dimensions are substantially smaller than about 30 nm.

18. A semiconductor device, comprising:

a fin provided in an upper surface of a substrate, said fin having a channel portion with a first width dimension and source/drain portions connected by said channel portion, said source/drain portions having a second width dimension which is substantially greater than said first width dimension; and a gate electrode disposed over said channel portion;

wherein said channel portion has a cross-section of a substantially double-sigma shape.

19. The semiconductor device of claim 18, further comprising an insulating material layer into which said channel portion is partially embedded, and wherein said channel portion is surrounded by said gate electrode such that an omega-shaped gate is provided.

20. The semiconductor device of claim 18, wherein said first and second width dimensions are substantially in parallel to a <110> crystal direction of said substrate and a height dimension of said fin is substantially parallel to a <100> crystal direction of said substrate.

* * * * *